(12) United States Patent  (10) Patent No.: US 8,680,660 B1
Law et al.  (45) Date of Patent: Mar. 25, 2014

(54) BRACE FOR BOND WIRE

(71) Applicants: Lai Cheng Law, Cheras (MY); Boh Kid Wong, Ipoh (MY); Weng Foong Yap, Phoenix, AZ (US)

(72) Inventors: Lai Cheng Law, Cheras (MY); Boh Kid Wong, Ipoh (MY); Weng Foong Yap, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/798,052

(22) Filed: Mar. 12, 2013

(51) Int. Cl.
H01L 23/495 (2006.01)

(52) U.S. Cl.
USPC ............ 257/676; 257/690; 257/773; 257/784

(58) Field of Classification Search
CPC ..... H01L 23/28; H01L 23/3107; H01L 23/48; H01L 23/495; H01L 23/49513; H01L 23/49517; H01L 23/4952
USPC .................................. 257/676, 690, 773, 784
See application file for complete search history.

(56) References Cited

U.S. PATENT DOCUMENTS

| 5,200,362 | A | 4/1993 | Lin |
| 5,273,938 | A | 12/1993 | Lin |
| 6,348,726 | B1 | 2/2002 | Bayan |
| 6,482,674 | B1 | 11/2002 | Kinsman |
| 7,541,222 | B2 * | 6/2009 | Magno et al. ................. 438/125 |
| 7,745,322 | B2 | 6/2010 | Lee |
| 2003/0080405 | A1 * | 5/2003 | Suzuki .......................... 257/690 |
| 2004/0124545 | A1 | 7/2004 | Wang |
| 2005/0224930 | A1 * | 10/2005 | Batish et al. .................. 257/666 |
| 2007/0105280 | A1 | 5/2007 | Li |
| 2012/0077316 | A1 | 3/2012 | Huang et al. |
| 2012/0145446 | A1 | 6/2012 | Yang et al. |

FOREIGN PATENT DOCUMENTS

JP 2000100854 A 4/2000

* cited by examiner

Primary Examiner — Peniel M Gumedzoe
(74) Attorney, Agent, or Firm — Charles Bergere

(57) ABSTRACT

In a semiconductor device having multiple tiers of bond wires extending in a first direction, dummy insulated bond wires extend in a second direction orthogonal to the first direction and between the wire tiers to support the wires in an upper tier to prevent them from sagging and contacting wires in a lower tier.

20 Claims, 2 Drawing Sheets

30  FIG. 2A

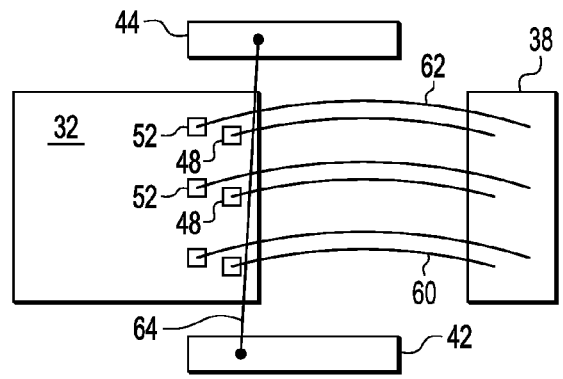
58 FIG. 3A
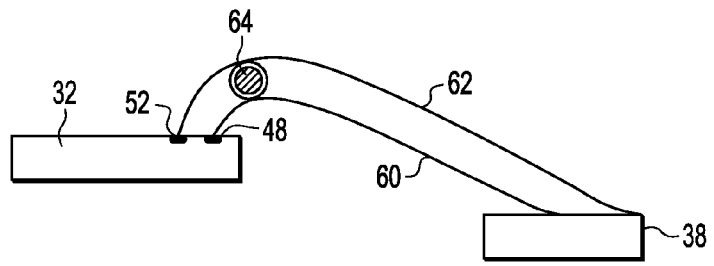
58 FIG. 3B
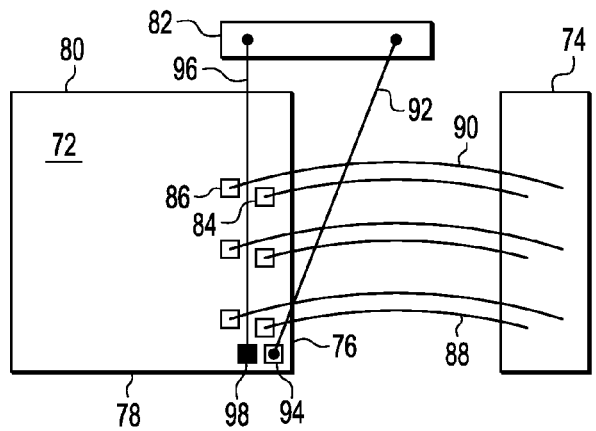
70 FIG. 4

BRACE FOR BOND WIRE

BACKGROUND OF THE INVENTION

The present invention relates to semiconductor devices having multiple tiers of bond wires and, more particularly, to a semiconductor device with a brace for preventing wires in separate tiers from contacting each other.

Many semiconductor devices use bond wires for connecting bonding pads of an integrated circuit die to leads of a lead frame or pads of a substrate. As integrated circuits have become smaller and include more functionality, multiple tiers of bond wires are needed to connect the die bond pads with leads/substrate pads. Referring to FIG. 1, a packaged semiconductor device 10 is shown. The device 10 includes an integrated circuit (IC) die 12 attached to a flag 14 of a lead frame with a die attach material such as an adhesive 16. The IC die 12 is electrically connected to leads of the lead frame with bond wires, with the leads providing for connection to external circuitry and devices. In this case, the device 10 includes a set of inner leads 18 and a set of outer leads 20. A first set of bond wires 22 connect bond pads of the die 12 to the inner leads 18 and a second set of bond wires 24 connect bond pads of the die 12 to the outer leads 20. The second set of wires 24 may be longer than the first set wires 22 because they extend from in-board bond pads to outer leads 20 whereas the wires of the first set 22 extend from bond pads near the edge of the die 12 to inner leads 18. Thus, the bonding wires of the second set 24 may have a substantial length.

Such devices with multiple tiers of bond wires often encounter wire short problems due to wire sagging. For example, since the wires of the second set 24 are long, they can have a tendency to sag, as shown with wire 26. Optimized looping profiles do not ensure 100% elimination of wire sagging. The incidence of shorting can be more problematic if there is only one row of leads (i.e., only outer leads 20) to which both sets of wires 22, 24 extend.

In view of the foregoing, it would be desirable to have a method of preventing wires from multiple tiers or of differing loop heights from shorting.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 2A is an enlarged top plan view of a partially assembled integrated circuit (IC) device in accordance with a first embodiment of the present invention;

FIG. 3A is an enlarged top plan view of a partially assembled IC device in accordance with a second embodiment of the present invention;

FIG. 3B is an enlarged partial side view of the IC device of FIG. 3A; and

FIG. 4 is an enlarged top view of a partially assembled IC device in accordance with a third embodiment of the present invention.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

In one embodiment, the present invention provides a semiconductor device including a die flag and an integrated circuit (IC) die attached to a top surface of the die flag. A plurality of first leads is spaced from a first side edge of the die flag. A first dummy lead is spaced from a second side edge of the die flag and a second dummy lead is spaced from a third side edge of the die flag opposite the second side edge. A plurality of first bond wires extend from a first set of bond pads on a top surface of the IC die to a first set of the plurality of first leads for electrically connecting the first set of bond pads to the first set of first leads. A plurality of second bond wires extend from a second set of bond pads on the top surface of the IC die to a second set of the plurality of first leads for electrically connecting the second set of bond pads to the second set of first leads. At least one insulated bond wire extends from the first dummy lead to the second dummy lead and between the first and second pluralities of bond wires. The at least one insulated bond wire prevents the plurality of second bond wires from sagging and contacting ones of the plurality of first bond wires.

In another embodiment, the present invention provides a semiconductor device having a die flag and an IC die attached to a top surface of the die flag. A plurality of first leads is spaced from a first side edge of the die flag and a dummy lead is spaced from a second side edge of the die flag that is adjacent to the first side edge of the die flag. A plurality of first bond wires extend from a first set of bond pads on a top surface of the die to a first set of the plurality of first leads for electrically connecting the first set of bond pads to the first set of first leads. A plurality of second bond wires extend from a second set of bond pads on the top surface of the integrated circuit die to a second set of the plurality of first leads for electrically connecting the second set of bond pads to the second set of first leads. At least one insulated bond wire extends from a third bond pad on a top surface of the IC die and near an edge of the IC die to the dummy lead and between the first and second pluralities of bond wires. The at least one insulated bond wire prevents the plurality of second bond wires from sagging and contacting ones of the plurality of first bond wires.

Figure 2B:
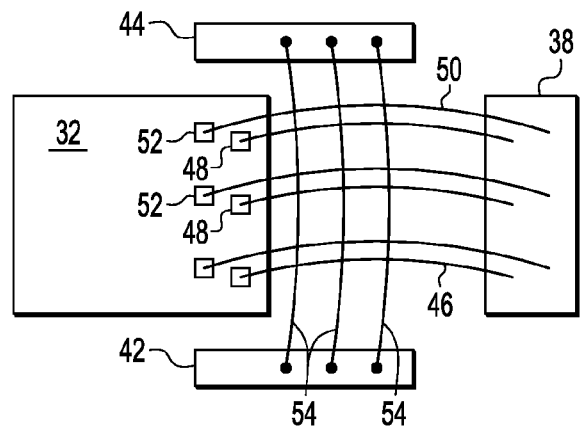
FIG. 2B is an enlarged partial side view of the IC device of FIG. 2A.
Figure 2B:
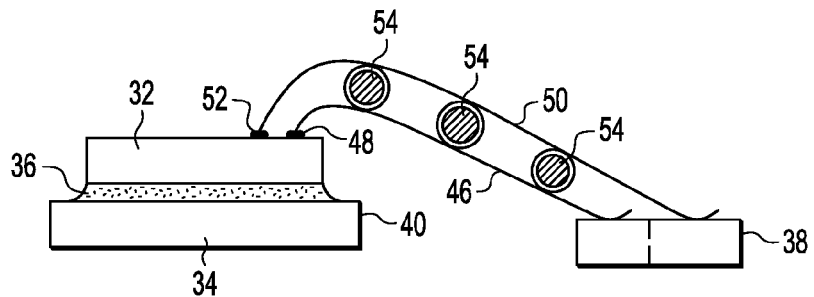

Referring now to FIGS. 2A and 2B, FIG. 2A is an enlarged partial top plan view of a semiconductor device 30 and FIG. 2B is an enlarged partial side view in cross-section of the device 30, in accordance with a first preferred embodiment of the present invention. The semiconductor device 30 has an integrated circuit (IC) die 32 supported on a die flag 34. The die flag 34 may be a lead frame flag or a die support area of a substrate, both of which are known to those of skill in the art. The IC die 32 is attached to a top surface of the die flag 34 with a die attach material or adhesive 36, also as is known in the art. The die attach material 36 is disposed between the IC die 32 and the top surface of the die flag 34 and secures the IC die 32 to the top surface of the die flag 34. The IC die 32 may comprise a processor, microcontroller, System on a Chip (SOC), or other known circuitry typically formed on a silicon substrate.

A plurality of first leads 38 are spaced from a first side edge 40 of the die flag 34. If the semiconductor device 30 is a lead frame type device, then the first leads 38 comprise lead fingers of the lead frame, and if the device 30 is a substrate type device, then the first leads 38 comprise substrate interconnection pads. Both lead frames and substrates for assembling semiconductor devices are known in the art and a full description is not necessary for a complete understanding of the invention.

The plurality of first leads 38 is shown as a single block for ease of illustration. However, as will be understood by those of skill in the art, the first leads 38 comprise individual leads or substrate connection pads. The first leads 38 may comprise a single or multiple rows of leads. Typically the leads are spaced from and surround the die flag 34, however, for ease of illustration, in the drawings the leads 38 are shown on only one side of the die flag 34.

In an embodiment of the invention, as shown in FIG. 2B, the top surface of the IC die 32 lies in a first plane and the plurality of first leads 38 lie in a second plane that is parallel to and spaced from the first plane, and more specifically, the first plane is higher than the second plane. Also, the die flag 34 and the first leads 38 both lie in the second plane.

The semiconductor device 30 also has a first dummy lead 42 spaced from a second side edge of the die flag 34 and a second dummy lead 44 spaced from a third side edge of the die flag 34 opposite the second side edge. The first and second dummy leads 42, 44 may comprise one or more individual leads or an elongate strip as shown FIG. 2A. In one embodiment of the invention, the first and second dummy leads 42, 44 are not used for electrical connections to pass signals between different points but instead, as explained below, for securing dummy bond wires.

A plurality of first bond wires 46 extend from a first set of die bond pads 48 on a top surface of the IC die 32 to a first set of the plurality of first leads 38 for electrically connecting the first set of die bond pads 48 to the first set of first leads 38. There also is a plurality of second bond wires 50 extending from a second set of die bond pads 52 on the top surface of the integrated circuit die 32 to a second set of the plurality of first leads 38 for electrically connecting the second set of die bond pads 52 to the second set of first leads 38.

In the embodiment shown, the first set of die bond pads 48 are located near and along an outer edge of the die 32 and the second set of die bond pads are spaced from the outer edge of the die 32 such that the first and second sets of die bond pads 48, 52 comprise two rows of die bond pads. The bond pads 48, 52 may be interleaved or non-interleaved with respect to each other.

The first and second pluralities of bond wires 46, 50 preferably comprise one of bare or plated copper, gold or aluminium wires, as is known in the art. In order to facilitate interconnection of the first and second sets of die bond pads 48, 52 to the first leads 38, the first and second pluralities of bond wires 46, 50 have different loop heights. That is, the second bond wires 50 are longer and have a greater loop height than the first bond wires 46.

The semiconductor device 30 also has at least one insulated bond wire 54 that extends from the first dummy lead 42 to the second dummy lead 44 and between the first and second pluralities of bond wires 46, 50 in order to prevent the plurality of second bond wires 50 from sagging and contacting ones of the plurality of first bond wires 46. In one embodiment of the invention, there are at least two insulated bond wires 54 that are spaced from and parallel to each other, and in another embodiment there are at least three insulated bond wires 54, each spaced from and extending generally parallel to the other two.

Coated or insulated bond wires are known in the art and commercially available. In a preferred embodiment of the invention, the insulated bond wire(s) have a diameter that is equal to or greater than a diameter of the first and second bond wires 46, 50. As previously discussed, in one embodiment, the first and second dummy leads 42, 44 are not used for transmitting signals off chip so the leads 42, 44 need only be sized and shaped to allow for attaching the insulated wires 54 using a wire bonding process.

Figure 1:
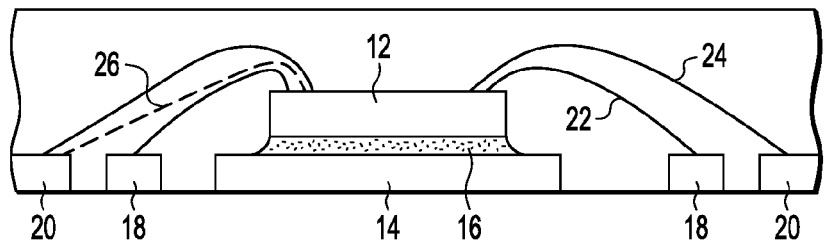
FIG. 1 is an enlarged cross-sectional view of a conventional integrated circuit (IC) device.

Like the convention device 10 shown in FIG. 1, the semiconductor device 30 includes a mold compound that encapsulates at least the top surface of the IC die 32, the first and second dummy leads 42, 44, the at least one insulated bond wire 54, the first and second pluralities of bond wires 46, 50, and a portion of the plurality of first leads 38, with an uncovered surface or portion of the first leads allowing for electrical interconnection to the IC die 32 by external circuits or devices.

Referring now to FIGS. 3A and 3B, FIG. 3A is an enlarged partial top plan view of a semiconductor device 58 and FIG. 3B is an enlarged partial side view in cross-section of the device 580, in accordance with a second preferred embodiment of the present invention. The semiconductor device 58 includes the integrated circuit (IC) die 32, the first leads 38, the first and second dummy leads 42, 44, and the first and second sets of die bonding pads 48, 52 on a top or active surface of the IC die 32. First and second sets of bond wires 60 and 62 electrically connect the first and second sets of die bonding pads 48, 52 with the first leads 38. The second set of bond wires 52, since they extend from the inner row of bond pads 52, have a greater loop height than the first set of bond wires 60. In this embodiment, just a single insulated wire 64 extends from the first dummy lead 42 to the second dummy lead 44 and between the first and second sets of bond wires 60, 62 to provide support to the second set of bond wires 62 so that the second set of bond wires 62 will not sag and contact the first set of bond wires 60. Although the insulated wire 64 is shown as traversing between the first and second sets of bond wires 60, 62 near to the IC die 32, the insulated wire 64 could be located such that it traverses between the first and second sets of bond wires 60, 62 at a location between the IC die 32 and the first leads 38, such as approximately midway between the IC die 32 and the first leads 38.

Referring now to FIG. 4, an enlarged, partial top plan view of a partially assembled semiconductor device 70 in accordance with a third embodiment of the present invention is shown. The semiconductor device 70 includes an IC die 72 mounted on a die flag (not shown) and a plurality of first leads 74 spaced from a first side edge 76 of the die 72. Second and third side edges of the die 72 are indicated at 78 and 80, respectively.

There is a dummy lead 82 spaced from the third side edge 80 of the die 72. The die 72 has a plurality of die bonding pads, in this example shown as disposed in two rows with die bonding pads 84 being in an outer row (closest to the side edge 76) and die bonding pads 86 being in an inner row relative to the die bonding pads 84. Of course, as with the other embodiments, an IC die may have multiple rows of die bonding pads around all four sides thereof and corresponding rows of leads around all four of its sides.

A plurality of first bond wires 88 extend from the outer row of die bonding pads 84 to a first set 92 of the first leads 74 for electrically connecting the outer row of die bonding pads 84 to the first set 92 of the first leads 74, and a plurality of second bond wires 90 extend from the inner row of die bonding pads 86 to a second set 94 of the plurality of first leads 74 for electrically connecting the inner row die bonding pads 86 to the second set 94 of the first leads 74. In this embodiment, the second bond wires 90 are longer than the first bond wires 88 and have a greater wire loop height than the first bond wires 88.

There is a first insulated bond wire 92 that extends from a first additional die bonding pad 94 located on a top surface of the IC die 72 and near the corner where the first and second side edges 76 and 78 of the IC die meet to the dummy lead 82 and between the first and second pluralities of bond wires 88, 90. The first insulated bond wires 92 prevents the plurality of second bond wires 90 from sagging and contacting ones of the plurality of first bond wires 88. In this embodiment, the first additional die bonding pad 94 could be a dummy pad. Alternatively, the first additional pad 94 could be an active pad used for transmitting a signal to the dummy lead 82 or for receiving voltage (power or ground) or a signal transmitted from the dummy lead 82, in which the dummy lead 82 is not really a dummy lead but an actual power, ground or signal lead.

The semiconductor device 70 also may include a second insulated bond wire 96 that extends from a second additional die bonding pad 98 located on the top surface of the IC die 72 and near the second side edge 78 to the dummy lead 82 and between the first and second pluralities of bond wires 88, 90. The second insulated bond wire 96 also helps to prevent the plurality of second bond wires 90 from sagging and contacting ones of the plurality of first bond wires 88. Like the first additional die bonding pad 94, the second additional die bonding pad 98 could be either a dummy pad or an active pad.

Thus, as is evident from the foregoing discussion, the present invention provides a means for preventing wire shorting between wires in different tiers of a device having multiple tiers of bond wires by providing a brace or support for the upper tier wires to prevent the upper tier wires from sagging. The brace or support may take the form of an insulated wire extending from one dummy lead to another dummy lead, from a die bond pad to a dummy lead, or even from a die bond pad to a functional lead. In the case of a multi-chip module, the brace/support wire could extend from a bond pad on a surface of a first IC die to a bond pad on a surface of a second IC die. The bond wires can be of aluminium, gold or copper and the finished device may be a BGA type device.

Thus, while the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A semiconductor device, comprising:
a die flag;
an integrated circuit die attached to a top surface of the die flag;
a plurality of first leads spaced from a first side edge of the die flag;
a first dummy lead spaced from a second side edge of the die flag;
a second dummy lead spaced from a third side edge of the die flag opposite the second side edge;
a plurality of first bond wires extending from a first set of bond pads on a top surface of the integrated circuit die to a first set of the plurality of first leads for electrically connecting the first set of bond pads to the first set of first leads;
a plurality of second bond wires extending from a second set of bond pads on the top surface of the integrated circuit die to a second set of the plurality of first leads for electrically connecting the second set of bond pads to the second set of first leads; and
at least one insulated bond wire extending from the first dummy lead to the second dummy lead and between the first and second pluralities of bond wires, wherein the at least one insulated bond wire prevents the plurality of second bond wires from sagging and contacting ones of the plurality of first bond wires.

2. The semiconductor device of claim 1, wherein the at least one insulated bond wire comprises two insulated bond wires, the two insulated bond wires spaced from and parallel to each other.

3. The semiconductor device of claim 1, wherein the at least one insulated bond wire comprises three insulated bond wires, each of the three insulated bond wires spaced from and parallel to each other.

4. The semiconductor device of claim 1, wherein the first and second pluralities of bond wires comprise one of bare copper wires, bare aluminium wires, and bare gold wires.

5. The semiconductor device of claim 1, wherein the first and second pluralities of bond wires have different loop heights.

6. The semiconductor device of claim 1, wherein the top surface of the integrated circuit die lies in a first plane and the plurality of first leads lie in a second plane that is parallel to and spaced from the first plane.

7. The semiconductor device of claim 3, wherein the first plane is higher than the second plane.

8. The semiconductor device of claim 1, further comprising a die attach material between the integrated circuit die and the top surface of the die flag for securing the integrated circuit die to the top surface of the die flag.

9. The semiconductor device of claim 8, further comprising a mold compound that encapsulates at least the top surface of the integrated circuit die, the first and second dummy leads, the at least one insulated bond wire, the first and second pluralities of bond wires, and a portion of the plurality of first leads.

10. A semiconductor device, comprising:
a die flag;
an integrated circuit die attached to a top surface of the die flag;
a plurality of first leads spaced from a first side edge of the die flag;
a first dummy lead spaced from a second side edge of the die flag;
a second dummy lead spaced from a third side edge of the die flag opposite the second side edge;
a plurality of first bond wires extending from a first set of bond pads on a top surface of the integrated circuit die to a first set of the plurality of first leads for electrically connecting the first set of bond pads to the first set of first leads;
a plurality of second bond wires extending from a second set of bond pads on the top surface of the integrated circuit die to a second set of the plurality of first leads for electrically connecting the second set of bond pads to the second set of first leads,
wherein the plurality of first bond wires have a different loop height than the plurality of second bond wires; and
at least one insulated bond wire extending from the first dummy lead to the second dummy lead and between the first and second pluralities of bond wires, wherein the at least one insulated bond wire prevents the plurality of second bond wires from sagging and contacting ones of the plurality of first bond wires.

11. The semiconductor device of claim 10, wherein the at least one insulated bond wire comprises two insulated bond wires, the two insulated bond wires spaced from and parallel to each other.

12. The semiconductor device of claim 10, wherein the at least one insulated bond wire comprises three insulated bond wires, each of the three insulated bond wires spaced from and parallel to each other.

13. The semiconductor device of claim 10, wherein the first and second pluralities of bond wires comprise one of bare copper wires, bare aluminium wires, and bare gold wires.

14. The semiconductor device of claim 10, further comprising a die attach material between the integrated circuit die and the top surface of the die flag for securing the integrated circuit die to the top surface of the die flag.

15. The semiconductor device of claim 14, further comprising a mold compound that encapsulates at least the top surface of the integrated circuit die, the first and second dummy leads, the at least one insulated bond wire, the first and second pluralities of bond wires, and a portion of the plurality of first leads.

16. A semiconductor device, comprising:
a die flag;
an integrated circuit die attached to a top surface of the die flag;
a plurality of first leads spaced from a first side edge of the die flag;
a dummy lead spaced from a second side edge of the die flag that is adjacent to the first side edge of the die flag;
a plurality of first bond wires extending from a first set of bond pads on a top surface of the die to a first set of the plurality of first leads for electrically connecting the first set of bond pads to the first set of first leads;
a plurality of second bond wires extending from a second set of bond pads on the top surface of the integrated circuit die to a second set of the plurality of first leads for electrically connecting the second set of bond pads to the second set of first leads; and
at least one insulated bond wire extending from a third bond pad on a top surface of the integrated circuit die and near an edge of the integrated circuit die to the dummy lead and between the first and second pluralities of bond wires, wherein the at least one insulated bond wire prevents the plurality of second bond wires from sagging and contacting ones of the plurality of first bond wires.

17. The semiconductor device of claim 16, wherein the at least one insulated bond wire comprises two insulated bond wires, wherein the second insulated bond wire extends from a fourth bond pad on the surface of the integrated circuit die proximate to the third bond pad to the dummy lead.

18. The semiconductor device of claim 16, wherein the first and second pluralities of bond wires have different loop heights.

19. The semiconductor device of claim 16, wherein the first and second pluralities of bond wires comprise one of bare copper wires, bare aluminium wires, and bare gold wires.

20. The semiconductor device of claim 16, further comprising:
a die attach material between the integrated circuit die and the top surface of the die flag for securing the integrated circuit die to the top surface of the die flag; and
a mold compound that encapsulates at least the top surface of the integrated circuit die, the first dummy lead, the at least one insulated bond wire, the first and second pluralities of bond wires, and a portion of the plurality of first leads.

* * * * *